United States Patent

[11] 3,584,269

[72] Inventor Rudolf E. Thun
Carlisle, Mass.
[21] Appl. No. 766,897
[22] Filed Oct. 11, 1968
[45] Patented June 8, 1971
[73] Assignee International Business Machines Corporation
Armonk, N.Y.

[54] DIFFUSED EQUAL IMPEDANCE INTERCONNECTIONS FOR INTEGRATED CIRCUITS
12 Claims, 33 Drawing Figs.

[52] U.S. Cl. .......... 317/235, 317/234, 148/186
[51] Int. Cl. .......... H01l 19/00
[50] Field of Search .......... 317/235, 22

[56] References Cited

UNITED STATES PATENTS

| | | | |
|---|---|---|---|
| 3,271,685 | 9/1968 | Husher et al. | 325/440 |
| 3,387,193 | 6/1968 | Donald | 317/235 |
| 3,491,274 | 1/1970 | Hubner et al. | 317/235 |
| 3,460,050 | 8/1969 | Hellstrom | 317/235 |
| 3,416,049 | 12/1968 | Bohn et al. | 317/235 |
| 3,383,614 | 5/1968 | Emmons et al. | 330/23 |

*Primary Examiner*—John W. Huckert
*Assistant Examiner*—B. Estrin
*Attorneys*—Hanifin and Jancin and Norman R. Bardales

ABSTRACT: The method and apparatus for providing a semiconductor substrate having at least two conductive paths of equal impedance values. Each of the two paths include at least one diffused region in the substrate. The diffused regions of the two parts are provided with different resistivity and/or cross-sectional characteristics with respect to each other so as to compensate for differences in the spatial lengths of their associated conductive paths. Also, a multilevel interconnection grid utilizing the aforementioned diffused regions as one level and the conductive elements of a predetermined metallization pattern as another level. Also integrated circuit apparatus employing the aforementioned conductive paths and/or grid.

INVENTOR
RUDOLF E. THUN

BY Norman R. Bardales

ATTORNEY

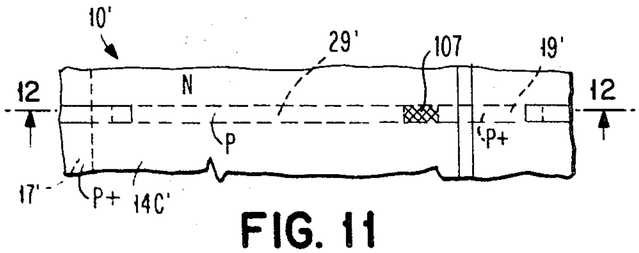
FIG. 11
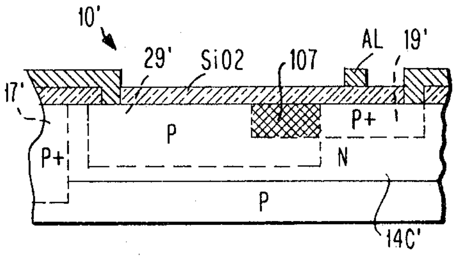
FIG. 12
FIG. 13
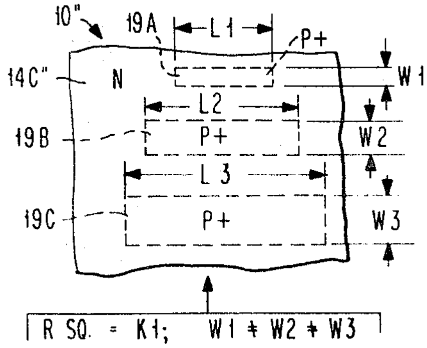
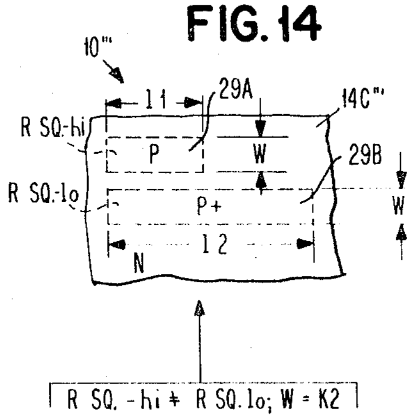
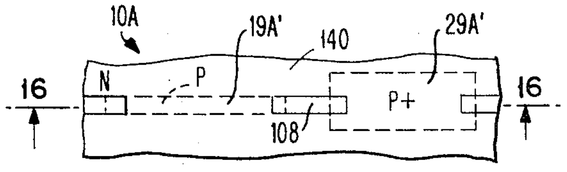
FIG. 15
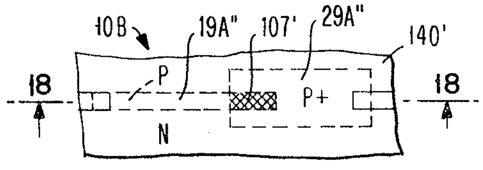
FIG. 17
FIG. 16
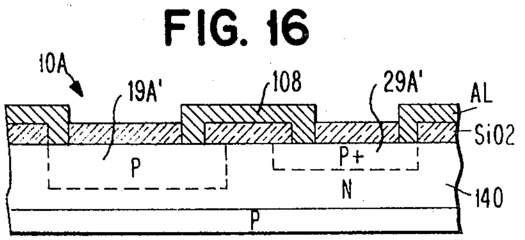
FIG. 18
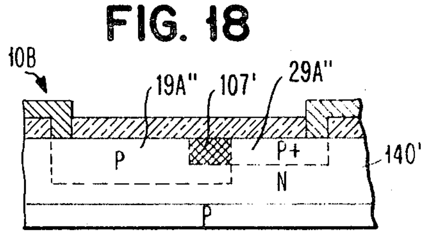

DIFFUSED EQUAL IMPEDANCE INTERCONNECTIONS FOR INTEGRATED CIRCUITS

CROSS-REFERENCES TO RELATED APPLICATIONS

The invention described in the U.S. Pat. application of Carl E. Ruoff entitled, "Monolithic Bipolar Transistor Logic Circuit and Method of Forming Same", Ser. No. 766,690 filed Oct. 11, 1968 and concurrently herewith and assigned to the same Assignee of the present invention incorporates some of the principles of the present invention.

BACKGROUND OF THE INVENTION

This invention relates to interconnection impedance apparatus and more particularly to interconnection impedance apparatus diffused in a semiconductor substrate.

Heretofore, diffused impedances, e.g. resistors, were formed in the substrate of an integrated circuit by diffusing therein a region with a uniform or constant resistivity and with uniform width and depth dimensions. By controlling the value of the resistivity and the length of the diffused region, the impedance or resistor was provided with a desired resistance value.

Diffused impedances so formed have not been found satisfactory in certain cases. For example, in certain cases it is desirable to provide two conductive paths having equal resistance values. If the spatial distance between the points to be connected by one path is equal to the spatial distance to be connected by the other path then the aforementioned diffused resistors of the prior art may be employed. However, when these spatial differences are not equal it has been the custom in the prior art to form the diffused region of the shorter path by increasing the effective length thereof so as to be equivalent to the effective length of the diffused region of the other path. This was accomplished in the prior art by forming the diffused region of the shorter path in a serpentine configuration, for example. However, the diffused regions of both the long and short paths still were provided with a uniform or constant resistivity and with uniform width and depth dimensions. With advent of large scale integration, the space available on the integrated circuit substrate for making diffused impedance interconnections became less and less available and consequently the aforementioned prior art diffused interconnections such as the serpentine type were not readily adaptable to the requirements of large scale integration.

Furthermore, it has been found preferable in the fabrication of integrated circuits of the monolithic type to provide only one layer of metallization for making onchip, i.e. substrate, connections. While two or more metallization layers with interleaving layers of insulation have been contemplated, from a cost and yield point of view, it is preferable to use only one metal layer. However, in the fabrication of complex monolithic integrated circuit chips, each of which contains many circuits, there is a finite limitation for the number of intercircuit connections that can be made with a single metallization layer. When only one layer of metallization is used, the technique heretofore for making crossover connections is customarily to provide a high conductivity underpass region in the form of a strip having a uniform high resistivity characteristic and uniform width and depth dimensions which is diffused into the wafer or substrate and electrically isolated against the rest of the wafer by the PN junction so formed and from the metallization pattern by an insulating layer. In other words a P region is diffused into an N substrate, or an N region is diffused into a P substrate. Unfortunately, this technique cannot be extended easily to provide cross-connections of appreciable length because of the high resistivity of the diffused strip. The aforementioned technique consequently is not readily adaptable to large scale integration where extended diffused interconnections may be required between various distributed points in the monolithic integrated circuit chip. This is particularly true for monolithic integrated circuits which have diffused bipolar devices such as bipolar transistors that require in general low impedance coupling or, where input resistors are used, require a fixed resistance value.

SUMMARY OF THE INVENTION

It is an object of this invention to provide interconnection impedance apparatus that has at least two conductive paths of equal impedance values, each of which includes a region diffused in a semiconductor substrate with each region being provided with different resistivity and/or cross-sectional characteristics.

Another object of this invention is to provide an integrated circuit employing the aforementioned interconnection impedance apparatus, and particularly integrated circuit apparatus of the monolithic bipolar type.

It is another object of this invention to provide the aforementioned diffused interconnection impedance apparatus as one level of a multilevel interconnection grid and a predetermined metallization pattern as another level thereof.

Still another object of this invention is to provide the aforementioned equal impedance conductive paths between various distributed points of an integrated circuit structure which paths have variable spatial distances between the points.

In accordance with one aspect of the invention there is featured an interconnection impedance apparatus comprising a semiconductor substrate having at least one region of a predetermined conductivity type. Also provided are at least first and second conductive paths having substantially equal impedance values. Each of the paths have at least one region of opposite conductivity type diffused in the regions of the substrate having the predetermined conductivity type. Each of the regions of the path has a respective predetermined resistivity characteristic and a predetermined cross-sectional characteristic. At least one of the last mentioned characteristics of the region of one path is different from the corresponding characteristic of the region of the other path.

The foregoing and other objects, features, and advantages of the invention will be apparent from the following more particular description of the preferred embodiments of the invention, as illustrated in the accompanying drawing.

BRIEF DESCRIPTION OF THE DRAWING

FIG. 11 is a partial top view of another embodiment of a diffused interconnection impedance apparatus of the present invention;

FIG. 12 is a partial cross-sectional view taken along the line 12–12 of FIG. 11;

FIG. 13 is a partial top view of still another embodiment of the diffused interconnection impedance apparatus of the present invention;

FIG. 14 is a partial top view of still another embodiment of the diffused interconnection impedance apparatus of the present invention;

FIG. 15 is a partial top view of still another embodiment of diffused interconnection impedance apparatus of the present invention;

FIG. 16 is a partial cross-sectional view taken along the line 16–16 of FIG. 15;

FIG. 17 is a partial top view of still another embodiment of the diffused interconnection impedance apparatus of the present invention; and FIG. 18 is a partial cross-sectional view taken along the line 18–18 of FIG. 17.

In the Figures, like elements are designated with similar reference numerals.

DESCRIPTION OF THE PREFERRED EMBODIMENTS

Figures 1, 1A, 1B, 1C, 2, 2A, 2B:
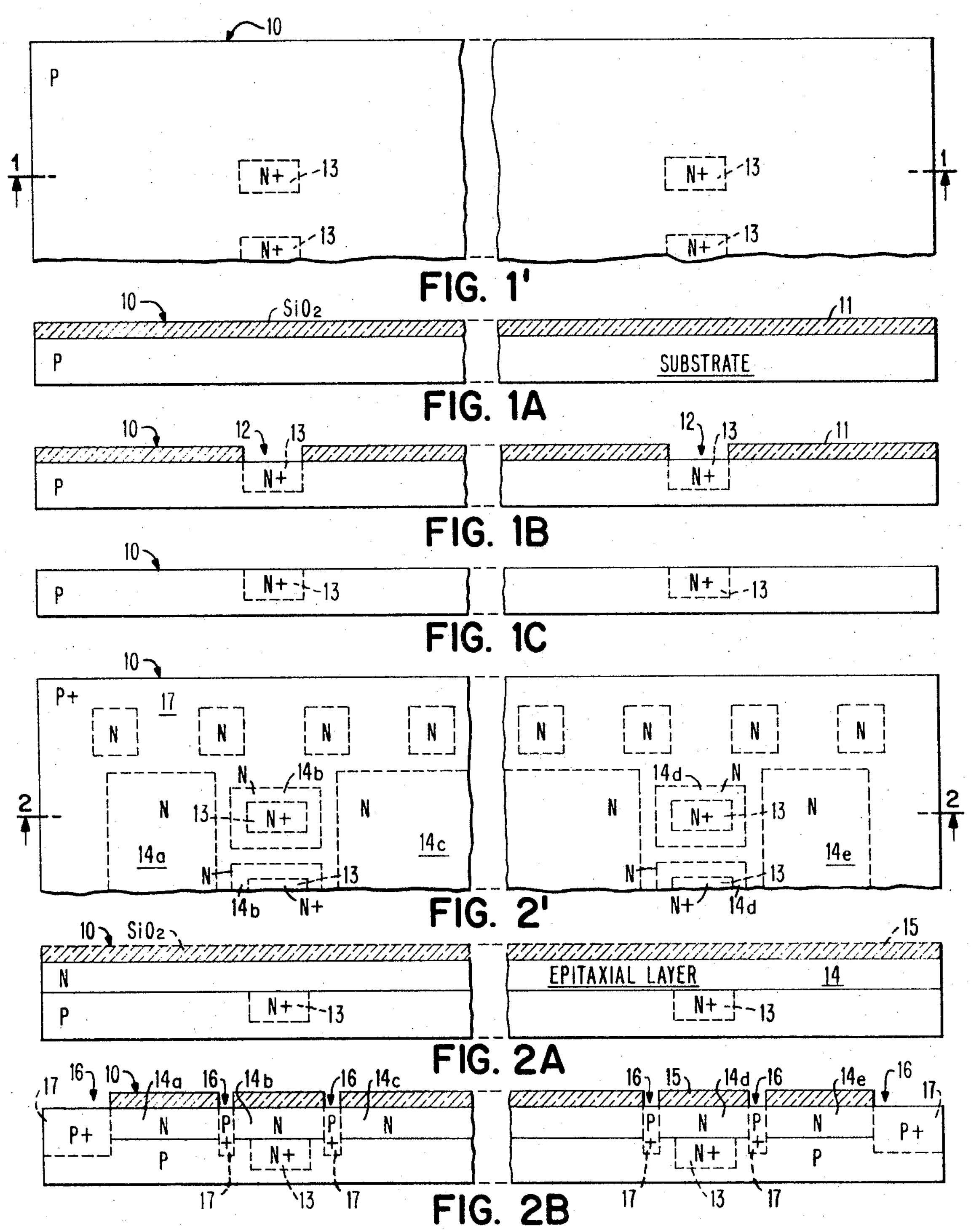
FIGS. 1'—5' are partial top views of a semiconductor substrate of a preferred structural embodiment of the interconnection impedance apparatus of the present invention illustrating various stages of its fabrication in accordance with a preferred method embodiment of the present invention.
FIGS. 1A—1C, 2A—2B, 3A, 4A—4B, 4C, 5A—5B, and 5C are partial cross-sectional views of the substrate of FIG. 1' taken along the lines 1–1 of FIG. 1', 2–2 of FIG. 2', 3–3 3 of FIG. 3', 4–4 of FIG. 4', 4C–4C of FIG. 4', 5–5 of FIG. 5', and 5C–5C of FIG. 5', respectively, illustrating various stages of the embodiment of the fabrication process shown in FIGS. 1'—5'.

In FIGS. 1′ to 10, inclusive, there are shown preferred method and structural embodiments of the diffused interconnection impedance apparatus of the present invention, together with embodiments of the interconnection grid and integrated circuit apparatus of the invention. More specifically, with reference to FIGS. 1′ to 10, there is first described herein an integrated circuit device of the monolithic type having a plurality of active and passive elements, and in which the active elements are bipolar transistor types. A characteristic of bipolar transistor types is that they require a low impedance input coupling, the coupling being generally a resistor in which case the integrated circuits are generally referred to as a resistor transistor logic circuit or simply RTL. In such circuits, the input resistors require constant, i.e. equal, resistance values.

Accordingly, in FIGS. 1′, 1A—1C a semiconductor substrate 10 is provided. Substrate 10 is preferrably a monocrystalline silicon planar structure fabricated in a manner well known to those skilled in the art and is of a predetermined conductivity type, e.g. P-type.

In FIG. 1A an oxide coating or layer, e.g. silicon dioxide layer 11, is next formed over the top surface of substrate 10. The layer 11 may be thermally grown on the upper surface of the substrate 10 in a manner well known to those skilled in the art. N+

Next, as shown in FIG. 1B, conventional masking and etching techniques have been employed to provide the openings 12 in the layer 11 which expose thereat predetermined portions of the upper surface of the substrate 10. Thereafter, a diffusion operation is performed downwardly from the upper surface of the substrate 10. As is well known to those skilled in the art, the diffusion is inhibited or prevented in the region of the substrate 10 which is under or is covered by layer 11; whereas the regions of substrate 10 which are exposed, i.e. not covered by the layer 11, become diffused. The diffusion is controlled until it reaches a predetermined depth. After the diffusion operation is terminated, there are formed diffused regions 13 which are shown in outline form for sake of clarity and which have an opposite conductivity type, e.g. N+ type, to that of the basic region, e.g. the P region, of the substrate 10. Each of the regions 13 provides a collector isolation region for the bipolar transistors of the integrated circuit being formed in the substrate 10. More particularly, in the particular example shown in FIG. 1, each region 13 forms a common N+ isolation region for three bipolar transistors hereinafter referred to sometimes as a three bipolar transistor cell or simply as a cell. Subsequent thereto the oxide layer 11 is removed by an etchant, for example, as shown in FIG. 1C.

Referring now to FIGS. 2′, 2A—2B, next there is formed on the upper surface of the substrate 10 an epitaxial layer 14, cf. FIG. 2A, by using conventional techniques well known to those skilled in the art. The epitaxially grown layer 14 provides a region of a predetermined conductivity type, e.g. N-type, in the substrate 10. After the epitaxial layer 14 is formed, the upper surface of the layer 14 is oxidized to form the oxidized layer 15 shown in outline form in FIG. 2A for sake of clarity. As a result, the oxidizing layer, e.g. silicon dioxide layer 15, completely covers the upper surface of the epitaxial layer 14. Next, using conventional masking and etching techniques, there are provided interconnected openings, e.g. openings 16, in the layer 15, cf. FIG. 2B, which expose thereat interconnected parts of the upper surface of layer 14.

Next, a diffusion process is performed downwardly to a predetermined depth from the upper surface of the substrate 10, which diffuses a region 17 of opposite conductivity type, e.g. P+ type, through the exposed parts of the upper surface of the N epitaxial layer or region 14 and partially into the P region of substrate 10. For reasons previously explained, only the regions of the substrate which have exposed upper surfaces are diffused. As a result, the N region 14 is subdivided by the P+ region 17 into isolated parts, e.g. subregions 14*a*—14*e*, cf. FIG. 2B. The subregions 14*a*, 14*c*, and 14*e* are each singular individual subregions and form the underlining isolation regions for the diffused impedance elements of the present invention subsequently to be formed therein as hereinafter described. Each of the plural subregions 14*b* and 14*d* form the common collector regions of the bipolar transistor cells being formed in the substrate 10 and which for the given conductivity type example will be NPN transistor types.

Figures 3, 3A:
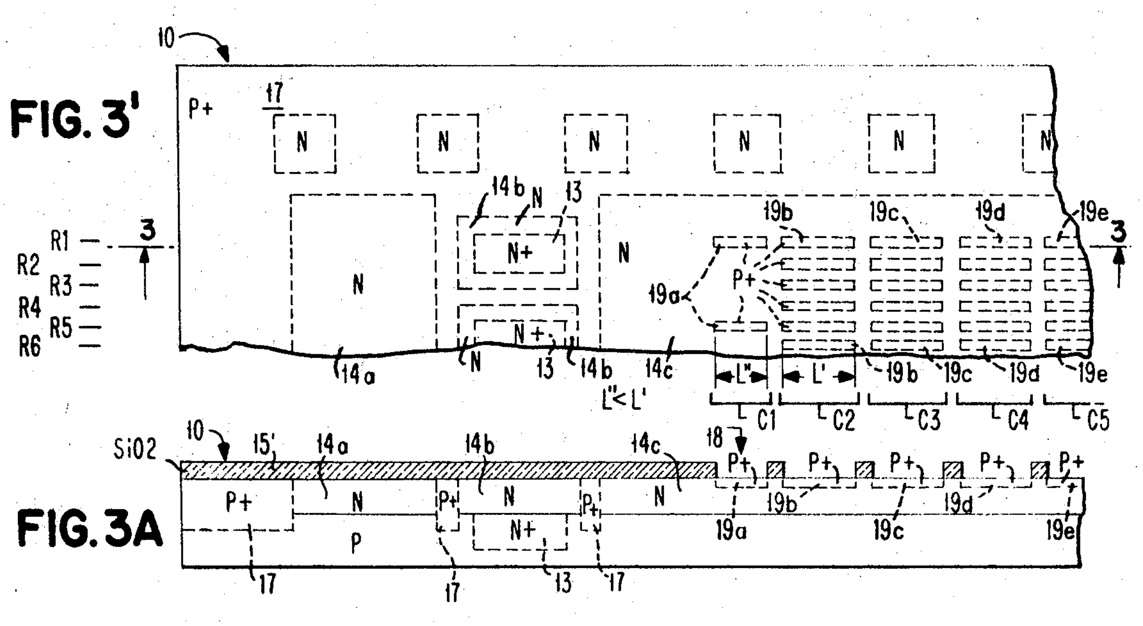

Referring now to FIGS. 3′ and 3A, thereafter the exposed upper interconnected surface parts of the P+ region 17 is again oxidized so as to form an integral oxidized coating or layer 15′, cf. FIG. 3A, over the entire upper surface of the substrate 10. For sake of clarity the integral layer 15′ is not shown. Thereafter, conventional masking and etching techniques are employed to provide openings, e.g. opening 18 of FIG. 3A, in the layer 15′ which expose preselected portions of the upper surface of the N epitaxial layer subregion 14*c*. Thereafter, a diffusion operation is downwardly performed and through these last mentioned openings, e.g. opening 18, regions, e.g. regions 19*a*,19*b*, etc., of opposite conductivity type, e.g. P+ type, are diffused into the N epitaxial region to a predetermined depth. One or more of these last diffused regions, e.g. regions 19*a*, etc. are utilized in the diffused interconnection impedance apparatus of the preferred embodiment of the present invention, as explained in greater detail hereinafter. Each of these regions, e.g. regions 19*a*, etc., has a predetermined resistivity or resistance per square Rsq such as, for example, 5 ohms per square. In the preferred embodiment, the P+ regions 19*a*, etc. are formed as linear elements and are symmetrically arranged in parallel horizontal rows and columns. In the particular example of integrated circuit devices shown in FIG. 3′, there are provided seven vertical columns of these P+ regions which column locations are designated in sequence from left to right as C1 to C7, respectively, only the first five column locations C1 to C5 being shown in FIG. 3′ for sake of explanation. For reasons which will become apparent from the description hereinafter, the rows are arranged in sets of four with the top horizontal row of each set having seven of the P+ regions 19*a* to 19*g* located in the column locations C1 to C7, respectively. The three other rows of each set have only five of these P+ regions 19*b to 19f* which correspond, i.e. are located, in their respective column locations C2 to C6. In FIG. 3′ the row locations are designated as R1, R2, etc. In the particular example of FIG. 3′ being described, a total of 48 three-transistor bipolar cells are symmetrically arranged in two vertical columns of 24 cells each.

These two cell columns are located on the left and right edges of the substrate as viewed from FIG. 3'. For the particular arrangement of FIG. 3', there are provided a total of 96 (24×4) rows R1—R96 of the aforementioned P+ regions which are diffused in the subregion 14*c*. In the embodiment shown in FIGS. 3, 3A, the depth and width dimensions of each of these P+ regions are uniform. Likewise, the respective lengths L' of each of the regions 19*b* to 19*f* are equal and the respective lengths L'' of the regions 19*a* and 19*g* are equal. However, the length L'' is less than the length L', cf. regions 19*a* and 19*b* of FIG. 3', for example. For purposes of explanation, the impedance value of each of the regions 19*a* and 19*g* is, for example, 25 ohms while that of each of the regions 19*b* to 19*f* is, for example 50 ohms.

Figure 4:
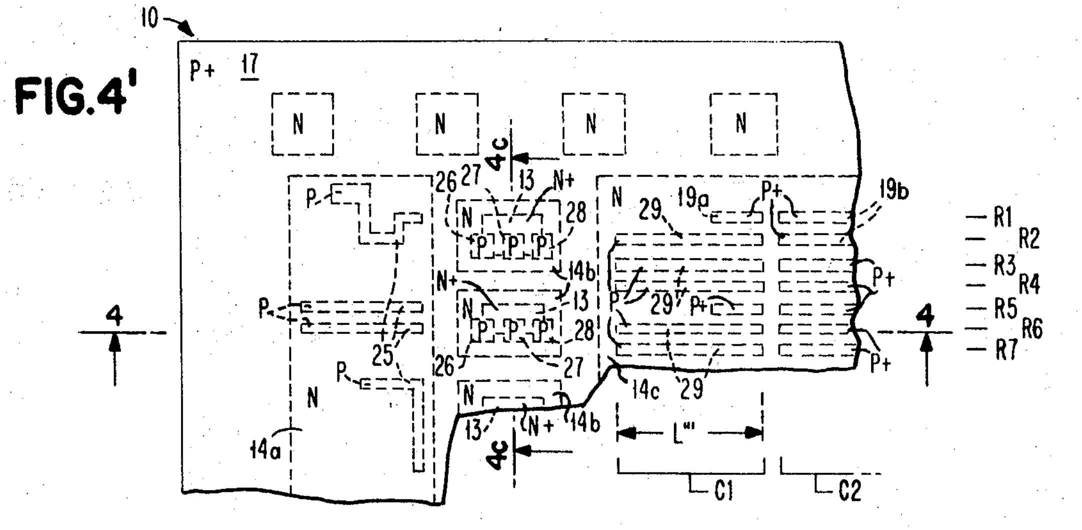
Figure 4A:
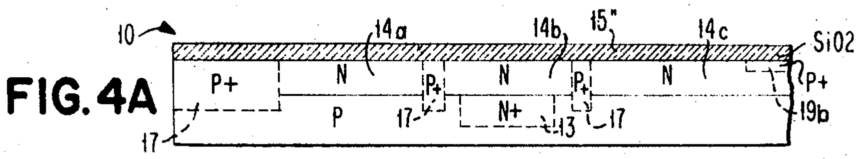
Figure 4B:
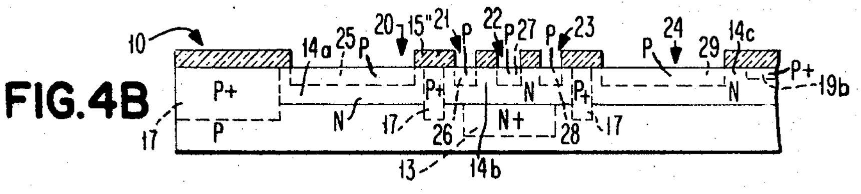
Figure 4C:
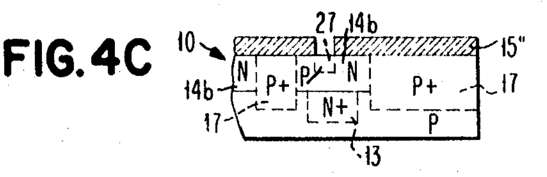

Referring now to FIGS. 4', 4A—4C, thereafter, as shown in FIG. 4A, the exposed upper surface parts of the regions 14*c* are again oxidized so as to form an integral new layer designated by the reference numeral 15'' for sake of clarity. The layer 15'' thus covers the entire upper surface of the substrate 10 and thereafter is provided with openings such as the openings 20, 21—23, and 24 shown in FIG. 4B so as to expose certain parts of the upper surface of the N subregions, 14*a*—14*e*, such as the subregions 14*a*,14*b*,14*c*, respectively, shown in FIG. 4B. Thereafter, another diffusion operation is downwardly performed and under these last mentioned exposed surface parts there are formed in the N subregions 14*a*—14*e*, new diffused regions of opposite conductivity, e.g. P regions, such as the P regions 25—29, cf. FIG. 4B. These P regions are diffused to a uniform depth and have a resistivity or resistance per square Rsq different from the resistivity of the previously diffused P+ regions, e.g. regions 19*a*,19*b*, etc., which are located in the subregion 14*c*. For example, the resistivity of the P regions, such as regions 25—29, may be 150 ohms per square. One or more of these P regions which are formed in the subregions 14*a*,14*c*,14*e*, such as the P regions 25 and 29 formed in the subregions 14*a* and 14*c*, respectively, shown in FIG. 4B, are utilized in the interconnection impedance apparatus of the present invention as explained in greater detail hereinafter. By way of example, the aforementioned uniform depth dimensions of these last formed P regions, e.g. 25, 29, are selected to be larger than that of the P+ regions, e.g., 19*a*,19*b*, etc. The depth dimension of the regions 25, 29 is also judiciously selected so that the regions 26—28 which are formed simultaneously therewith will also be sufficient for the subsequent diffusion of N+ regions therein as hereinafter described.

In the preferred embodiment, the P regions 29, which are exclusively formed in the middle N subregion 14*c*, are linear and have equal length dimensions L'''. Furthermore, the P regions 29 are symmetrically and horizontally arranged in parallel at locations corresponding to the two end column locations, i.e. C1 and C7, at the row locations which have only five P+ regions 19*b* to 19*f* per row, e.g. rows R2, R3, R4; R6, R7, R8; R10, R11, R12; etc. The longitudinal axes of the P regions 29 of a particular row are in alignment with the longitudinal axes of the P+ regions 19*b* to 19*f* of the particular row, and the width dimensions of the P regions 29 are substantially equal to those of the P+ regions 19*a*,19*b*, etc. For the given resistivity and uniform cross-sectional dimensions, i.e. the width and depth dimensions, the lengths L''' of the P regions 29 are judiciously selected so that the total impedance of each P region is the same, i.e. equal, and which for purposes of explanation in the given example is 1,000 ohms each.

The configurations of the P regions formed in the two end N subregions 14*a* and 14*e*, such as the P regions 25 of subregion 14*a*, are judiciously selected so that each of these particular P regions has the same total impedance, and which for purposes of explanation in the given example is 975 ohms. Shown in FIG. 4' are only four of the P regions 25 located in the subregion 14*a*. The top region 25 illustrated in FIG. 4' has a nonlinear configuration and is provided with two different width dimensions $W_y$,$W_x$ as shown in greater detail in FIG. 7, where $W_y$ is greater than $W_x$. The bottom region 25 illustrated in FIG. 4' also has a nonlinear configuration which is L-shaped. The other regions 25 illustrated in FIG. 4' have horizontal linear configurations and are arranged in parallel symmetrical relationship.

The three P regions, such as regions 26—28, which are formed in each of the N subregions 14*b* and 14*d*, provide the base regions of the three bipolar transistors of the particular cell with which the particular N subregion 14*b* or 14*d* is associated.

Figure 5:
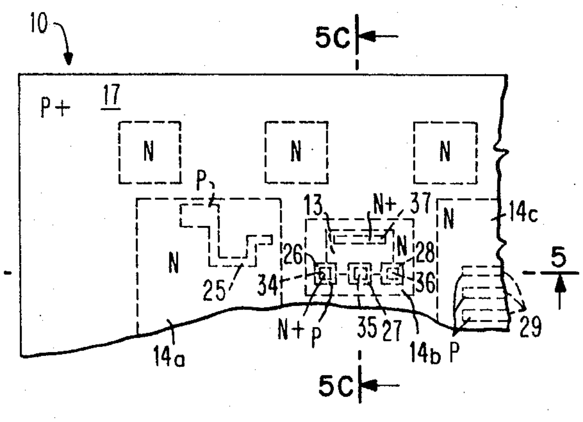
Figure 5B:
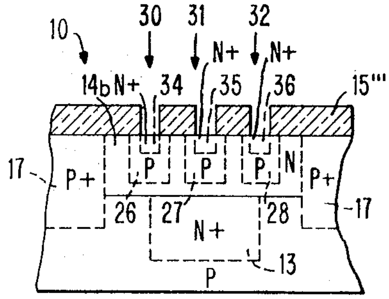
Figure 5C:
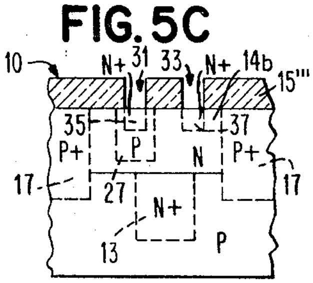
Figure 5A:
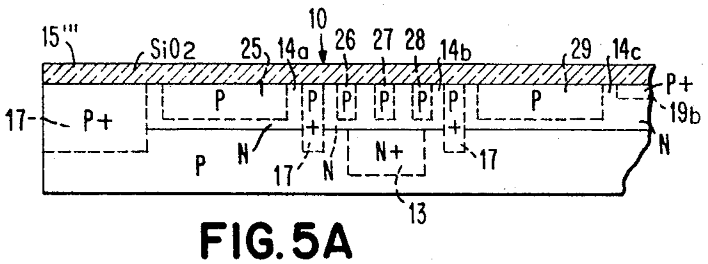

Referring now to FIGS. 5', 5A—5C, thereafter the exposed upper surfaces of the now P regions, e.g. regions 25—29, are oxidized resulting in the integral oxide layer 15''' shown in FIG. 5A. Thereafter, as shown in FIG. 5B, openings, e.g. 30—32, are provided in the layer 15'''. Each of these last-mentioned openings expose a certain part of the upper surface of the last formed P regions, e.g. regions 26—28 that are located in the N subregions 14*b* and 14*d*. An opening, e.g. opening 33, is simultaneously formed in each of the N subregions 14*b* and 14*d*, cf. FIG. 5C.

Subsequently, another diffusion operation is downwardly performed and under the openings, such as openings 30—33, there are formed in the substrate 10 N+ regions, such as N+ regions 34—37, respectively, cf. FIGS. 5', 5B and N+ Each of the N+ regions, e.g. regions 34—36, which is formed in one of the P regions, e.g. P regions 26—28, located in the N subregions 14*b* and 14*d* is an emitter region of a transistor being formed in the substrate 10. Each of the N+ regions, e.g. region 37, which is formed in the N subregions 14*b* or 14*d*, is a common collector contact region for the three bipolar transistors of a particular cell.

Figure 7:
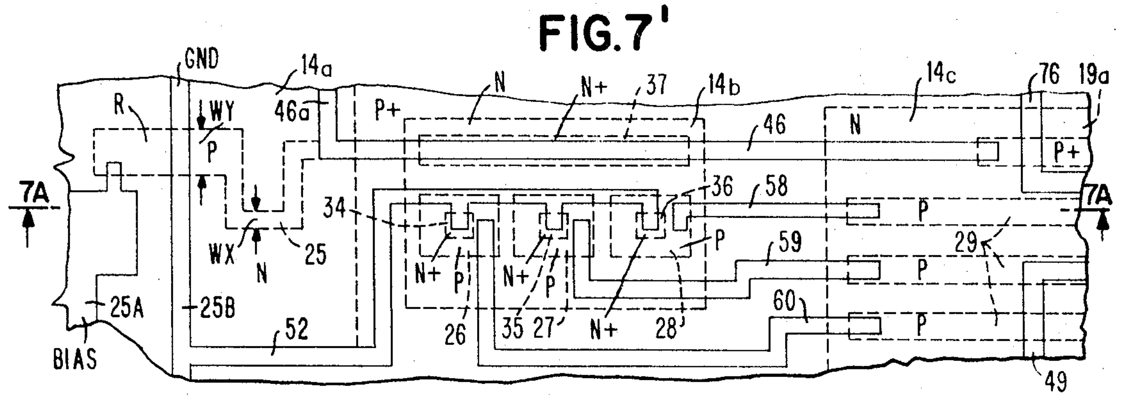
FIG. 7' is an enlarged partial top view of part of the substrate of FIG. 6A—6B.
Figure 7A:
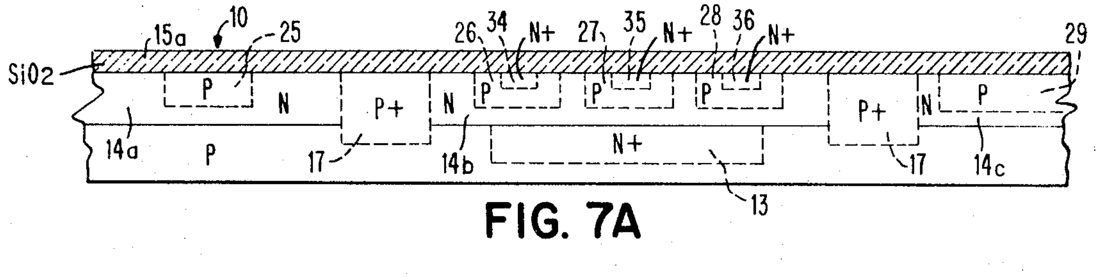
FIGS. 7A—7B are partial cross-sectional views of the substrate of FIG. 7' taken along the line 7–7 of FIG. 7 illustrating subsequent various steps of the embodiment of the fabrication process.
Figure 7B:
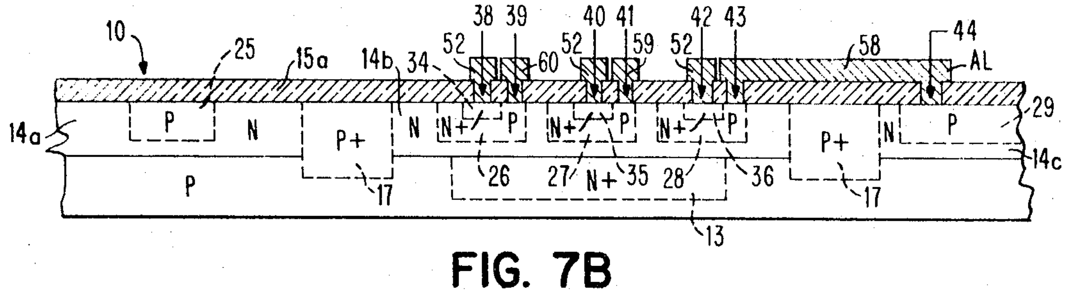
Figure 6A:
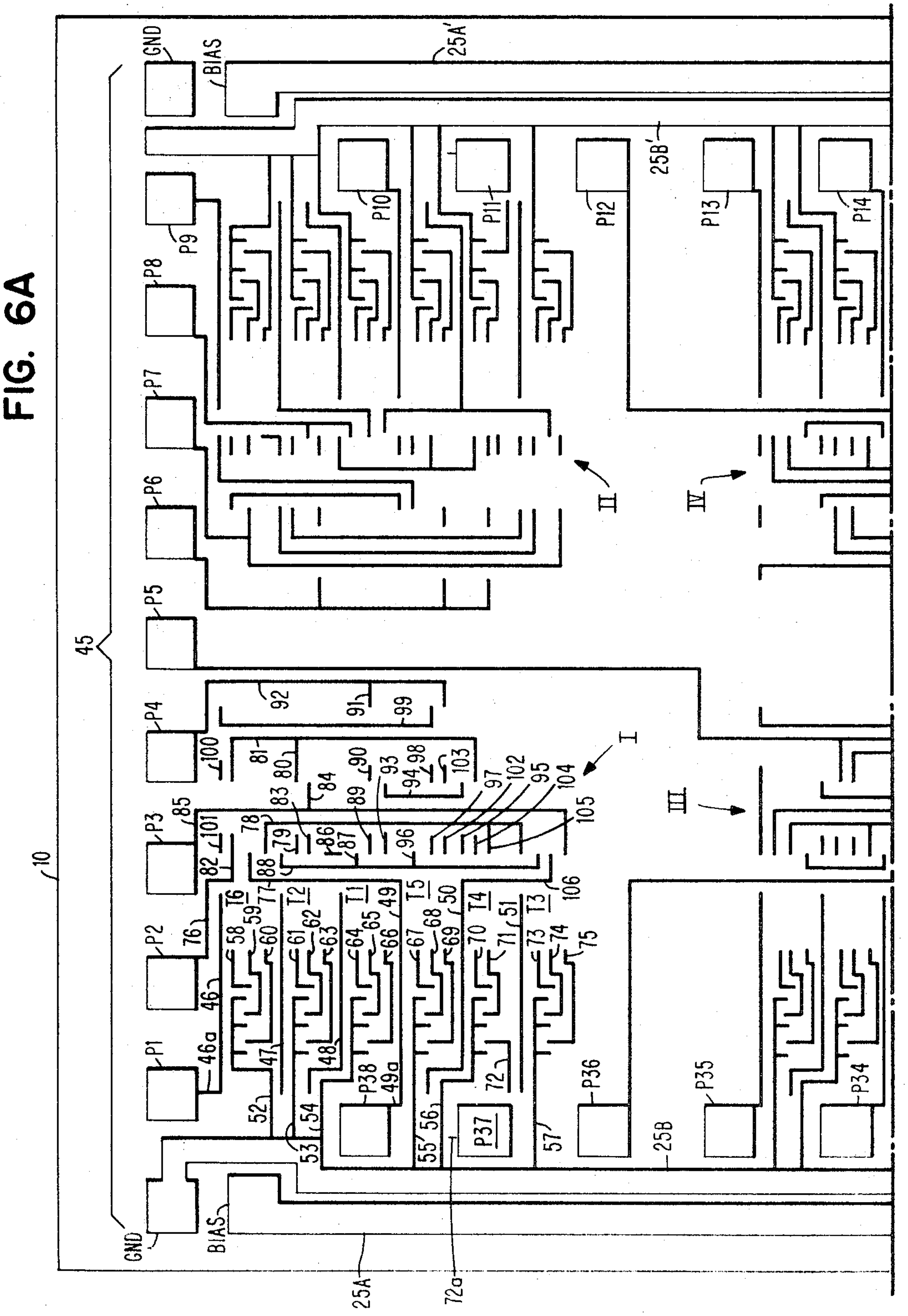
FIG. 6A—6B is a top view of the substrate of FIGS. 1'—5' after the metallization pattern has been formed thereon so as to provide the last-mentioned structural embodiment of the monolithic integrated circuit device of the present invention.
Figure 6B:
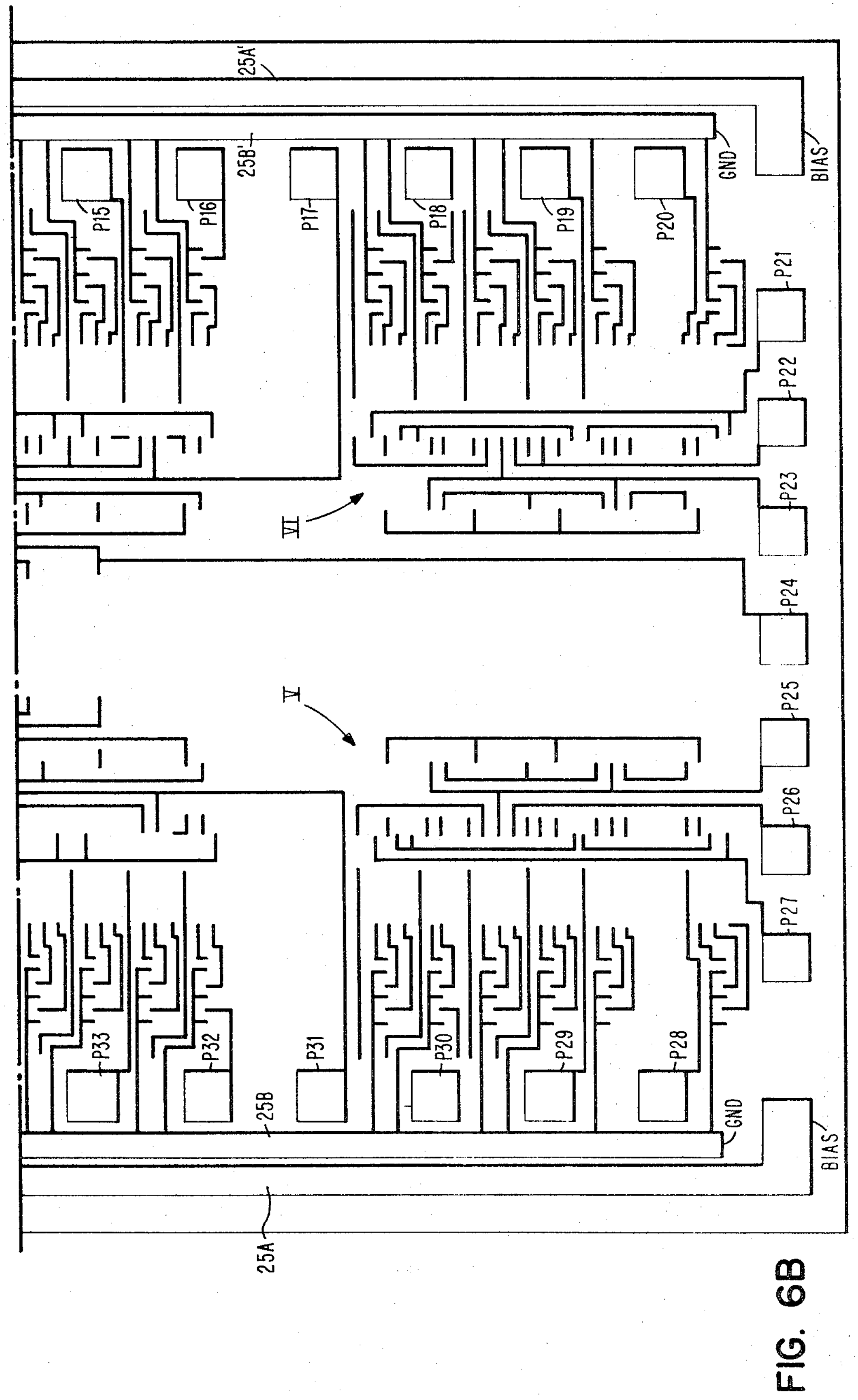

Referring now to FIG. 6A—6B, 7', 7A—7B, subsequent to the diffusion of the N+ regions, e.g. regions 34—37, the exposed upper surfaces of these N+ regions are oxidized forming the new oxide layer 15*a*, cf. FIG. 7*a*. The new layer 15*a*, which is also an electrical insulation as is well known to those skilled in the art, covers the entire upper surface of substrate 10. Next, the openings, e.g. openings 38—44, are provided in the layer 15*a*, cf. FIG. 7B, by using suitable masking and etching techniques. More specifically, for each transistor of each three bipolar transistor cell there is provided a pair of openings, e.g. the pair of openings 38 and 39, which expose the N+ emitter and P base regions, respectively, e.g. regions 34 and 26, respectively. Also for each three bipolar transistor cell an opening, not shown, is provided in the layer 15*a* which exposes the common N+ collector contact region, e.g. region 37. At the same time, there are provided in the N subregions 14*a*, 14*c*, and 14*e* for each of the diffused regions 19*a*—19*g*, 25, 29 a pair of openings of the particular diffused region at two parts, the spacing S between the openings of the pairs being selected in a manner hereinafter described. In FIG. 7B, opening 44 represents one of the pair of openings associated with the resistor 29, partially illustrated therein. Thereafter, a predetermined interconnection metallic, e.g. aluminum, pattern is formed on the upper surface of the layer 15*a*, such as the metallization pattern indicated generally by the reference numeral 45 in FIG. 6A—6B. The interconnection pattern 45 is formed in a manner well known to those skilled in the art such as, for example, by vacuum depositing a thin, even coating of aluminum over the entire upper surface of the layer 15*a* and onto the exposed upper surface of the substrate 10 which are exposed by the openings provided in the layer 15*a*. The interconnection pattern between circuit components or elements in the monolithic circuit is then formed in a manner well known to those skilled in the art such as by using photoresist techniques. More particularly, the undesired aluminum areas are etched away leaving a predetermined pattern of interconnections between preselected diffused circuit elements, to wit: the diffused transistors and diffused resistors of the monolithic circuit.

In the particular example shown in FIG. 6A—6B, a monolithic circuit is illustrated as being comprised of six functionally identical and noninterconnected subcircuits indicated generally by the reference numerals I—VI. The metallization pattern 45 comprises a plurality of metal, e.g. aluminum, conductors such as the conductors 45—106 shown in FIG. 6A or 10, and a plurality of input/output terminal pads located on the periphery of the substrate 10 and numbered in a clockwise manner by the reference characters P1—P38 for sake of clarity. The metallization pattern 45 of FIG. 6A—6B also included a pair of ground and a pair of bias terminals indicated generally by the legends GND and BIAS, respectively, and their associated conductors 25A, 25B, 25′, 25′. A more detailed description of each of the three bipolar transistor cells and its associated passive circuitry, and each of the subcircuits I—VI will now be described with reference to FIGS. 8—10.

Figure 8:
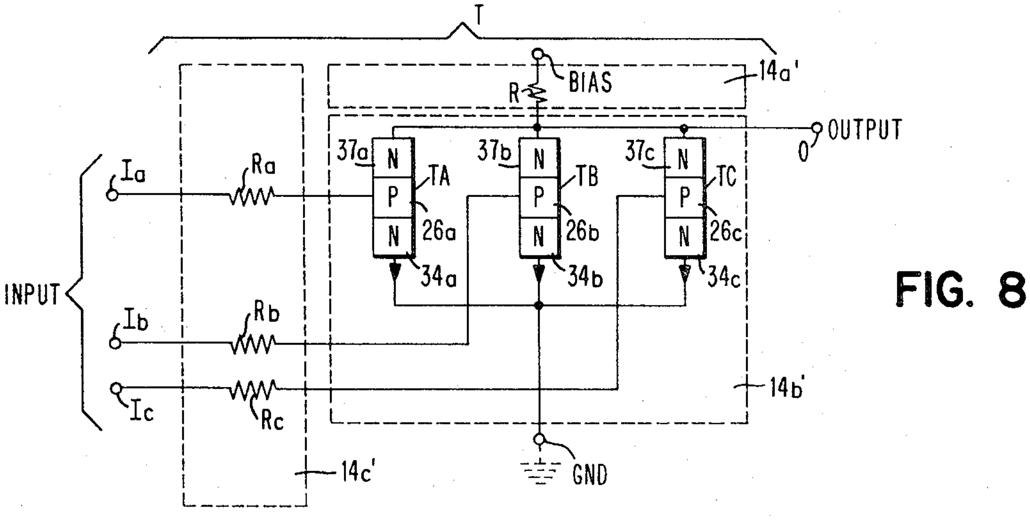
FIG. 8 is a schematic view of a typical three bipolar transistor cell and its associated input and bias circuitry utilized in one of the integrated circuits associated with the monolithic integrated circuit device of FIG. 6A—6B.

As shown schematically in FIG. 8, each three transistor bipolar cell 14*b*′ includes three bipolar NPN transistors TA, TB, TC having respective base electrodes 26*a*,26*b*,26*c*, emitter electrodes 34*a*,34*b*,34*c*, and collector electrodes 37*a*, 37*b*, 37*c*. The transistors TA—TC are configured as commonly grounded emitter amplifiers which are connected in parallel. More particularly, a common output OUTPUT is connected to the three output collector electrodes of the transistors. The common output OUTPUT is shown schematically as being terminated by a terminal designated by the reference letter O. The transistors are biased via a common biasing resistor R which corresponds to one of the diffused P regions 25 located in the subregion 14*a* or 14*e* as the case may be. The resistor R is connected to a bias terminal BIAS, and the resistor R is illustrated in FIG. 8 in the block 14*a*′ for sake of clarity. Each base electrode is connected to one of the substantially equal input resistances R*a*—R*c* shown in the block 14*c*′. Each of the input resistances R*a*—R *c* is schematically shown as being connected in turn to one of the respective input terminals INPUTS and designated individually therein as I*a*, I*b* and I*c*. Each of the resistances R*a*—R*c* is in general comprised of an individual region 29 either alone or in combination with one or more of the regions 19*a* to 19*g* in the manner hereinafter described. In some cases, some of the resistances R*a*—R*c* may be comprised individually of a P region, which is located in one of the N subregions 14*a* or 14*e*, such as the region 25′, FIG. 10, hereinafter described. The particular circuit shown in FIG. 8 is further configured as a trigger circuit T of the aforementioned RTL type.

Figure 9:
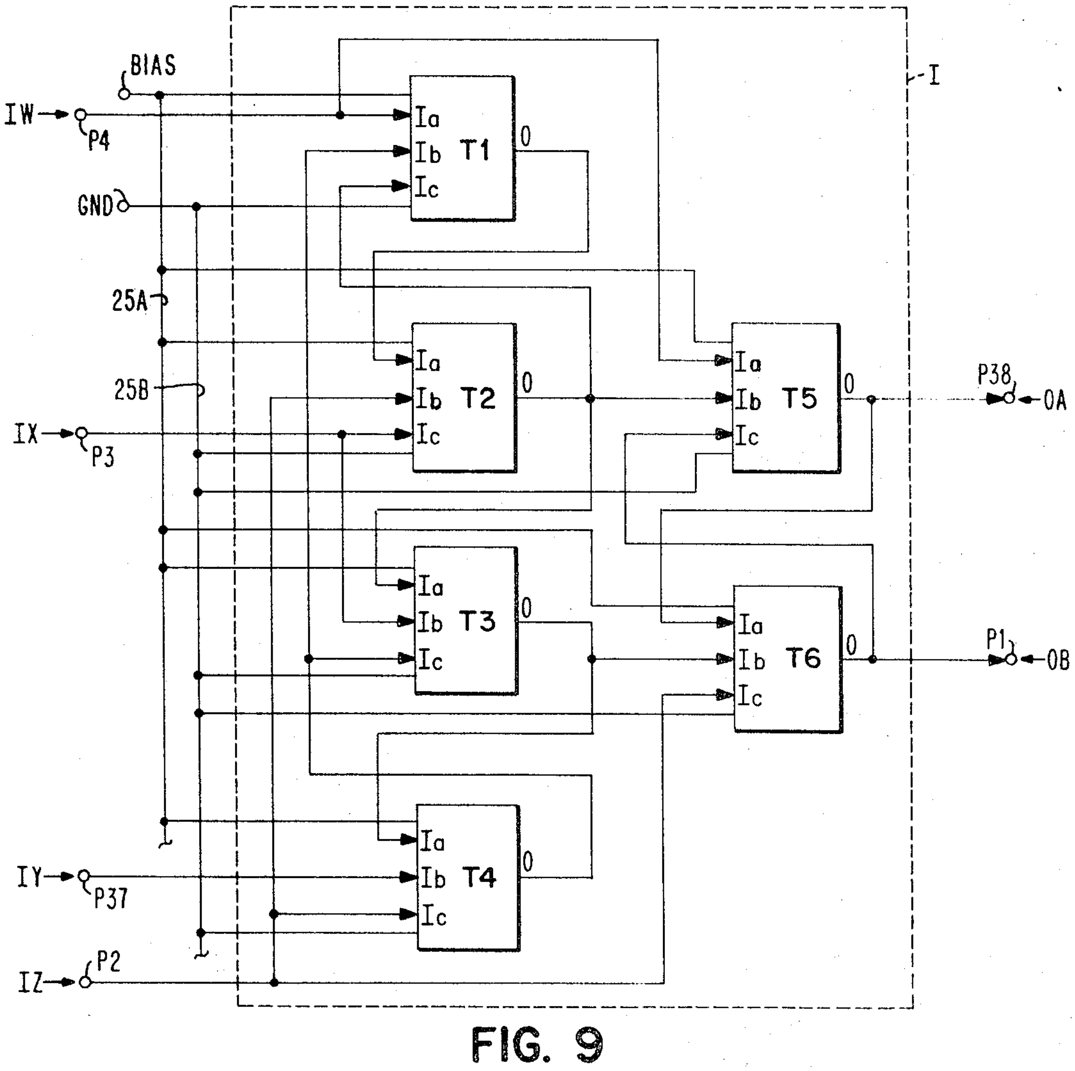
FIG. 9 is a schematic view shown in block form of one of the integrated circuits of FIG. 6A—6B wherein each of the blocks illustrated therein corresponds to the circuit of FIG. 8.

Each of the subcircuits I—VI, as shown in greater detail by the subcircuit I in FIG. 9, comprises six trigger circuits T1—T6. Each trigger circuit T1—T6 is similar in configuration to the trigger circuit T of FIG. 8. Each of the subcircuits I—VI has four inputs, I*w*,I*x*,I*y*,I*z* and a pair of outputs OA, OB. The input I*w* is connected to the respective inputs I*a* of triggers T1 and T5. The input I*x* is connected to the input I*c* of trigger T2 and the input I*b* of trigger T3. Input I*y* is connected to the input of I*b* of trigger T4. Input I*z* is connected to the input I*b* of trigger T2 and to the respective inputs I*c* of triggers T4 and T6. The output O of trigger T1 is connected to the input I*a* of trigger T2; and the output O of trigger T2 is connected to the input I*c* of trigger T1, the input I*a* of trigger T3 and the input I*b* of trigger T5. The output O of trigger T3 is connected to the input I*a* of trigger T4 and the input I*b* of trigger T6. The output O of trigger T4 is connected to the input I*b* of trigger T1 and the input I*c* of trigger T3. The output O of trigger T5 is connected to the input I*a* of trigger T6 and the output terminal OA. Output O of trigger T6 is connected to the input I*c* of trigger T5 and the output terminal OB. The reference numerals 25A, 25B, P1—P4, P37 and P38 shown in FIG. 9 correspond to the reference numerals shown in FIGS. 6A and 10 with reference to the subcircuit I.

Figure 10:
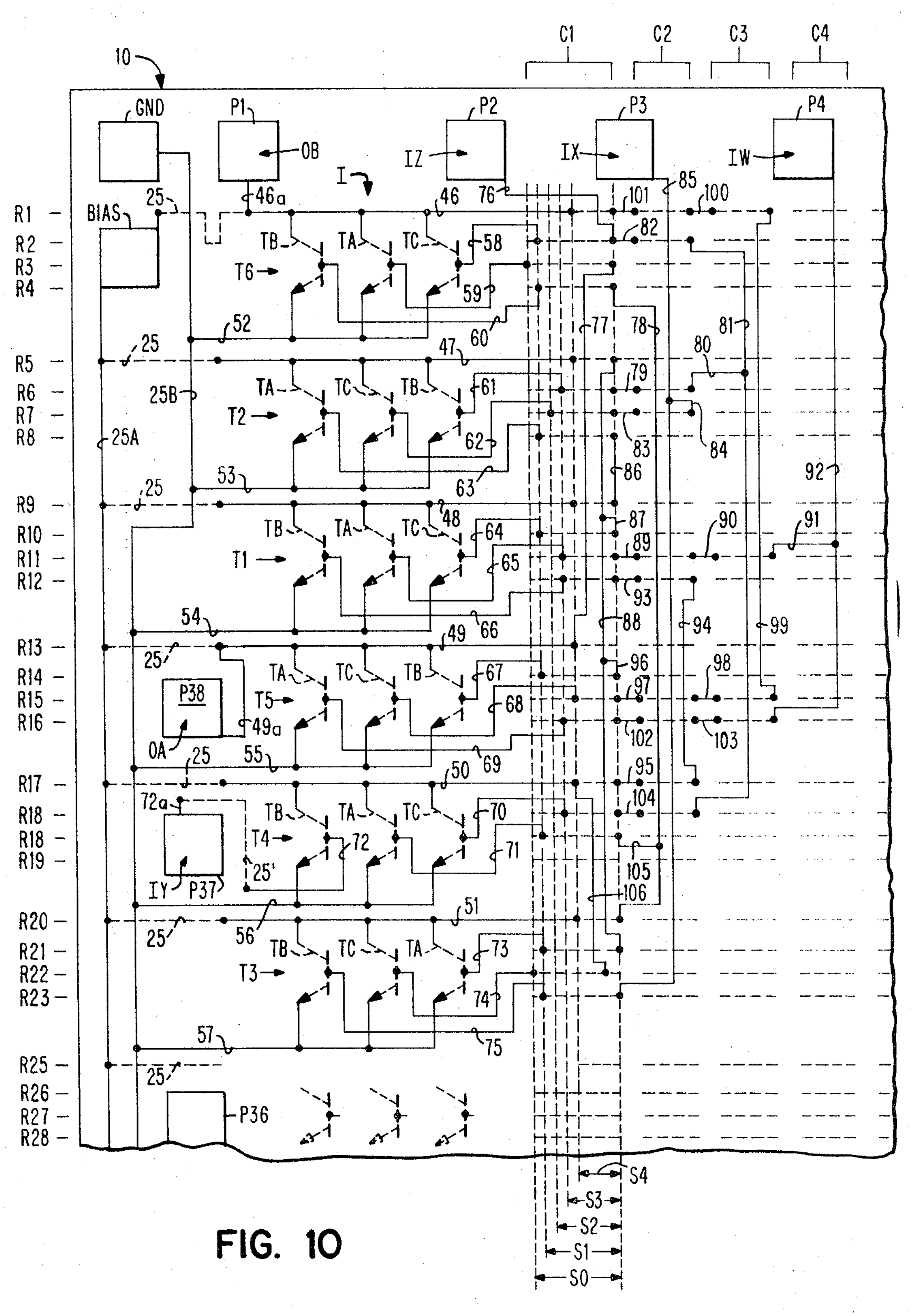
FIG. 10 is an enlarge partial top view of the substrate of FIG. 6A—6B which schematically illustrates one of the circuits thereof as shown in FIG. 9, the diffused circuit elements thereof being illustrated in FIG. 10 in outline form for sake of clarity.

Before discussing FIG. 10, it will be assumed for purposes of explanation that the transistors of the circuits I—VI have input conductive paths of equal impedance values of, for example, a 1,000 ohms each. As aforementioned, in RTL type circuits it is critical that the input impedance associated with each of the transistors be equal. It will also be assumed that the transistor cells of the circuits I—VI have bias conductive paths of equal impedance values of, for example, 1,000 ohms each also. It is desirable in RTL circuits that the impedance value associated with the bias impedance of each of the transistors be equal although it is not as critical as in the case of their input impedances, as aforementioned. For purposes of explanation, it will be assumed that the impedance value of each of the metal conductors of the conductive pattern 45 is also negligible and that the impedance value of each of the terminal pads P1, etc. and each of the terminal pads BIAS and GND are equal and, for example, are 25 ohms each.

As shown in greater detail in FIG. 10, the subcircuit I comprises the six aforementioned triggers which are laid out in the vertical sequence from top to bottom as follows: T6, T2, T1, T5, T4, and T3. Moreover, it should be noted that for each of the triggers T1—T6 the sequence of transistors TA—TC from left to right are not the same. For trigger T6 the sequence is TB, TA, TC; for trigger T2 the sequence is TA, TC, TB; for trigger T1 the sequence is TB, TA, TC; for trigger T5 the sequence is TA, TC, TB; for trigger T4 the sequence is TB, TA, TC; and for trigger T3 the sequence is TB, TC, TA. Each of the trigger circuits T1—T6 is associated with the one of the conductors 46—51. Each conductor 46—51 connects a diffused P region 25, to the common collector contact region, e.g. region 37, of the bipolar transistor cell which is part of the trigger circuit with which the particular conductor 46—51 is associated. The P regions 25 are connected to the terminal pad BIAS by a suitable metal conductor such as, for example, the conductor 25A. Each of the conductors 52—57 is connected to the ground terminal pad GND via the metal conductor 25B and is associated with one of the trigger circuits T1—T6. Each of the conductors 52—57 is also commonly connected to the three emitter regions, e.g. regions 34—36, of the bipolar transistor cell which is part of the trigger circuit with which the particular one of the conductors 52—57 is associated. Thus as shown in FIG. 10, each bias conductive path terminates at a common collector region of a transistor cell and includes a diffused region 25 and the common bias terminal pad BIAS, which region 25 and pad BIAS collectively provide the desired impedance value of the path which in the given example is a total of 1,000 ohms and comprises the 975 ohm impedance value of the region 25 and the 25 ohm impedance value of the common pad BIAS.

Each of the conductors 58—75 of the pattern 45 is exclusively connected to one of the base regions, e.g. region 28, of the transistors of the circuits T1—T6 with the exception of conductor 72. Each of the conductors 58—75 with the exception of conductor 72 is connected in a manner hereinafter described at its other end to the region 29 which is adjacent to the particular conductor. Conductor 72 is connected at its other end to a diffused region 25′ which is formed simultaneously in the N subregion 14*a* with the other regions 25 and which has, as aforementioned, the same impedance value as the regions 25, which in the given example is 975 ohms. Region 25′ is connected by conductor 72*a* to the input terminal pad P37 which corresponds to the input I*y* shown in FIG. 9. Thus for the given example, the individual impedance values of 25 and 975 ohms of the pad P37 and region 25′, respectively, provide the input conductive path of transistor TB of trigger T4 with the aforementioned 1,000 ohm impedance value.

It can be readily shown from the following Table I that the input conductive paths associated with the other transistors of the circuits T1—T6 are likewise provided with the same input impedance value which in the given example, as aforementioned, in 1,000 ohms. In Table I there is indicated for each input path of each transistor TA, TB, TC of each trigger T1—T6; the terminus of the particular input path; the reference character of the diffused element or elements included in the particular path; the coordinate column and row locations of the diffused element or elements of the path; the metal elements of the conductive pattern 45 included in the particular path, those metal elements of which were assumed to have negligible impedance being shown parenthetically therein for purposes of clarity; and for each path the individual impedance values of the diffused elements and of those metal elements which were assumed to have impedance values in accordance with the values selected for the given example.

TABLE I

| Input path | Terminus | Diffused elements | Co-ordinates locations | Metal elements | Resistance (ohms) |
|---|---|---|---|---|---|
| Trigger T6: | | | | | |
| TC | P2 | 29(S1) | C1, R2 | (58, 76) | 975 |
| | | | | P2 | +25 |
| Total | | | | | 1,000 |
| TA | O-T5(49) | 29(S0) | C1, R3 | (59, 77) | 1,000 |
| TB | O-T3(51) | 29(S1) | C1, R4 | (60, 78) | 975 |
| | | 19a | C1, R21 | — | +25 |
| Total | | | | | 1,000 |
| Trigger T2: | | | | | |
| TB | P2 | 29(S3) | C1, R6 | (61, 79, 80, 81, 82, 76) | 875 |
| | | 19b | C2, R6 | | 50 |
| | | 19b | C2, R2 | — | 50 |
| | | | | P2 | +25 |
| Total | | | | | 1,000 |
| TC | P3 | 29(S2 | C1, R7 | (62, 83, 84, 85) | 925 |
| | | 19b | C2, R7 | | 50 |
| | | | | P3 | +25 |
| Total | | | | | 1,000 |
| TA | O-T1(48) | 29(S1) | C1, R8 | (63, 86) | 975 |
| | | 19a | C1, R9 | — | +25 |
| Total | | | | | 1,000 |
| Trigger T1: | | | | | |
| TC | O-T2(47) | 29(S1) | C1, R10 | (64, 87, 88) | 975 |
| | | 19a | C1, R5 | — | +25 |
| Total | | | | | 1,000 |
| TA | P4 | 29(S3) | C1, R11 | (65, 89, 90, 91, 92) | 875 |
| | | 19b | C2, R11 | | 50 |
| | | 19c | C3, R11 | — | 50 |
| | | | | P4 | +25 |
| Total | | | | | 1,000 |
| TB | O-T4(50) | 29(S3) | C1, R12 | (66, 93, 94, 95) | 875 |
| | | 19b | C2, R12 | | 50 |
| | | 19b | C2, R17 | — | 50 |
| | | 19a | C1, R17 | — | +25 |
| Total | | | | | 1,000 |
| Trigger T5: | | | | | |
| TB | O-T2(47) | 29(S1) | C1, R14 | (67, 96, 88) | 975 |
| | | 19a | C1, R5 | — | +25 |
| Total | | | | | 1,000 |
| TC | O-T6(46) | 29(S4) | C1, R15 | (68, 97, 98, 99, 100, 101) | 725 |
| | | 19b | C2, R15 | | 50 |
| | | 19c | C3, R15 | | 50 |
| | | 19c | C3, R1 | — | 50 |
| | | 19b | C2, R1 | — | 50 |
| | | 19a | C1, R1 | — | +25 |
| Total | | | | | 1,000 |
| TA | P4 | 29(S3) | C1, R16 | (69, 102, 103, 92) | 875 |
| | | 19b | C2, R16 | | 50 |
| | | 19c | C3, R16 | — | 50 |
| | | | | P4 | +25 |
| Total | | | | | 1,000 |
| Trigger T4: | | | | | |
| TC | P2 | 29(S3) | C1, R18 | (70, 104, S1, 82, 76) | 875 |
| | | 19b | C2, R18 | | 50 |
| | | 19b | C2, R2 | — | 50 |
| | | | | P2 | +25 |
| Total | | | | | 1,000 |
| TA | O-T3(51) | 29(S1) | C1, R19 | (71, 105, 78) | 975 |
| | | 19a | C1, R21 | — | +25 |
| Total | | | | | 1,000 |
| TB | P37 | 25′ | Sub-region 14a | (72, 72a) | 975 |
| | | | | P37 | +25 |
| Total | | | | | 1,000 |
| Trigger T3: | | | | | |
| TA | O-T2(47) | 29(S1) | C1, R22 | (73, 88) | 975 |
| | | | C1, R5 | — | +25 |
| Total | | | | | 1,000 |
| TC | O-T4(50) | 29(S0) | C1, R23 | (74, 106) | 1,000 |
| TB | P3 | 29(S1) | C1, R24 | (75, 85) | 975 |
| | | | | P3 | +25 |
| Total | | | | | 1,000 |

In Table I, the outputs of the various triggers have been designated as O–T followed by the number of the particular trigger circuit. Included parenthetically next to these designations O–T1, etc. is the reference numeral of the actual metal element of the pattern 45 which forms the terminus of the path. Shown parenthetically next to each of the elements 29 is the spacing provided between the two metal conductors which are connected to the particular region 29. The spacings are designated SO, S1, S2, S3, and S4 as shown in FIG. 10 and represent a predetermined portion of the length L''' of the P regions 29. It should be understood that the relative scale of the spacings S0, S1, etc. is purposely distorted in resistivity 10 for sake of clarity. Diffused regions provided with the spacing SO allows the entire impedance value of the region 29 to be included in the particular input impedance path of the transistor to which it is connected. Diffused regions provided with the spacing S1 allows a smaller portion of the impedance value to be included in the input path and which for the given example this portion is equivalent to 975 ohms. Shown in Table II below are the impedance values of those portions of the diffused regions 29 having the spacings SO—S4 for the particular example being described.

TABLE II

| Spacing: | Resistance (ohms) |
|---|---|
| S0 | 1,000 |
| S1 | 975 |
| S2 | 925 |
| S3 | 875 |
| S4 | 725 |

Thus, as shown in FIG. 10, there are provided at least two input conductive paths which have substantially equal impedance values and which are comprised of diffused elements having different resistivity characteristics, e.g. the input path associated with transistor TA of trigger T6 and the input conductive path associated with the transistor TB of trigger T2. More particularly, as shown in Table I the input path of transistor TA of trigger T6 includes only one diffused region 29 which has the aforementioned resistivity of 150 ohms per square. On the other hand, the input path of transistor TB of trigger T2 includes a portion of the region 29 and two of the diffused regions **19*b*, the latter two regions having the lower resistivity characteristic of 5 ohms per square. Likewise, as shown in FIG. 10 there are provided two conductive paths which have at least two different cross-sectional configurations such as, for example, the bias path associated with the transistors of trigger T6 and the bias path associated with the transistors of trigger T2. In this last mentioned example, the region 25** of the bias conductive path of trigger T6 has a portion thereof with a width dimension W*y* which is larger than the width dimension of the region 25 associated with the bias path of trigger T2.

In those cases where the impedance value of a metal conductor or conductors included in a particular path is significant, then the spacing of the pair of metal conductors associated with the diffused regions 25, 25′, or 29 included in the particular path may be further judiciously selected to compensate for the impedance value of the conductor(s). More specifically, the spacing for the particular diffused region 25, 25′, or 29 during the aforedescribed etching operation of the mask **15*a*, cf. FIG. 7B, is selected so that the impedance values of the diffused region 25, 25′, or 29 and of the diffused region or regions 19*a*—19*g*, if any, and of the pad, e.g. pads P1—P38** or BIAS, if any, and of the metal conductor or conductors which are included in the path collectively provide the described impedance value, e.g. 1,000 ohms.

It should be understood that in making integrated circuit apparatus of the type described in FIGS. 1—10, the location of the various active and passive diffused regions in the chip or substrate 10 are standardized. Thus, only the personality of the metallization pattern 45 changes depending on the particular circuit to be formed in the substrate is desired to have. Accordingly, the etching masks utilized for the various aforedescribed diffusion operations are standardized and only a different contact and metallization etching mask need be provided for a different circuit function, configuration and/or interconnection pattern.

It should also be further understood that all of the active and passive elements formed in the substrate 10 need not be used as shown in FIGS. 6A—6B or 10, and/or that the particular subcircuits I—VI can be further interconnected by other logical circuits utilizing the unused active and/or passive elements.

As shown in FIG. 10, the individual diffused regions 29 are isolated from the other diffused regions 19*a*—19*g* by the material of N subregion 14*c*. In those cases where interconnection between a diffused region 29 or a portion thereof and one of the regions 19*a*—19*g* is to be made, there is provided a metal conductor of the pattern 45 such as the metal conductor 83, cf. FIG. 6A or FIG. 10. However, as shown in the embodiment of FIG. 11 and in greater detail in FIG. 12 the diffused regions 29' and 19' may be formed so that they overlap as shown by the cross-hatching area 107. The combined input impedance of the two regions 29', 19' may be calculated algebraically.

In FIG. 13 there is shown another embodiment of the diffused interconnection apparatus of the present invention wherein each of the diffused regions 19A, 19B, 19C have the same resistivity or resistance per square Rsq designated by the constant K1. The regions 19A—19C are formed simultaneously in the region 14*c''* of semiconductor substrate 10'', partially shown, and have uniform depth dimensions but are provided with different width dimensions W1, W2, W3 and different length dimensions L1, L2, L3. The width and length dimensions of the regions 19A—19C are judiciously selected so that each region has the same impedance value.

Alternatively, as shown by the embodiment of FIG. 14, there is provided two diffused regions 29A and 29B. The regions 29A and 29B are formed simultaneously in the region 14*c'''* of semiconductor substrate 10''', partially shown, and have uniform cross-sectional dimensions, the width dimension W being designated therein by the constant K2. The region 29A is provided with a high resistivity or resistance per square Rsq-hi and a length 11. Region 29B has a resistivity or resistance per square Rsq-lo lower than Rsq-hi and a length 12 which is greater than the length 11. The resistivities of the regions 29A and 29B and their respective lengths 11, 12 are judiciously selected so that each of the regions 29A and 29B have equal impedance values.

In the embodiment shown in FIGS. 15—16, a low resistivity region 19A' and a region 28A' of higher resistivity are formed in the region 140 of the semiconductor substrate 10A, partially shown. Each of the regions 19A' and 29A' have different width and depth dimensions as well as different resistivities. If desired, the width and depth dimensions of the regions 19A' and 29A' may be judiciously selected so that for their respective given length dimensions and resistivities the impedance values of the regions 19A' and 29A' are equal to each other.

The embodiment of FIGS. 17—18 is similar to that of the embodiment of FIG. 15 except that the regions 19A'' and 29A'' are formed so that they overlap each other as shown by the cross-hatching area 107' in lieu of the metal conductor 10B which interconnects the regions 19A' and 29A ' of FIG. 15.

In accordance with another aspect of the present invention, there is provided an interconnection grid which utilizes the aforementioned diffused regions, e.g. regions 25, 29, 19*a*—19*g* of FIG. 10, as one level and the conductive elements, e.g. conductors 25*a*, 25*b*, 46—106, of the metallization pattern, e.g. pattern 45, as another level. In the preferred embodiment preselected ones of these diffused regions act as the passive impedance elements of the equal impedance conductive paths, e.g. the bias or input paths, as the case may be, of the diffused active elements, i.e. the transistors TA, TB, TC. These diffused regions also act as the undercrossings for the conductors of the pattern 45. In the preferred embodiment, the diffused elements are generally arranged in a horizontal direction in multiple parallel rows, such as the aforementioned rows R1—R96, for example. Furthermore, the input/output terminals such as the pads P1—P38, as well as the ground and terminal pads, are located about the edges of the substrate 10, as aforementioned. Thus, the interconnections provided by the metallization pattern 45 and diffused regions, e.g. regions 19*a*—19*g*, 29, 25, are provided inwardly from the edges of the substrate 10 and the longer metal elements, i.e. conductors 81 or 92, for example, of the pattern 45 substantially cross over the diffused elements in a vertical direction so as to provide an interconnection grid having a rectangular configuration.

It is to be understood that in FIG. 10, some of the horizontal conductor elements or some of the horizontal portions of the conductor elements of pattern 45 are illustrated as being located between adjacent rows of the diffused impedance elements merely for sake of clarity so as to illustrate the unused portions of the regions 29 and/or unused diffused regions 19*a*, etc., cf. horizontal right end portion of conductor 58 with relation to region 29, column C1, row R2, in FIG. 10, for example. However, it is to be understood that in practice these horizontal conductor elements or portions would lie in alignment over the particular unused portion of the diffused region as generally indicated in FIG. 6A—6B and as illustrated in greater detail in FIGS. 7', 7B. Thus, the diffused regions, such as region 29 for example, also act as a diffused undercrossing for some of the horizontal conductor elements of the pattern 45.

It should be understood that while the invention has been described with a particular diffused active element type, i.e. an NPN bipolar transistor, and/or a particular logic circuit, i.e. a trigger circuit, that the invention may be employed with integrated circuits having other types of active devices, e.g. diodes, and/or conductivities, e.g. PNP transistors, and/or logic circuits having other functions such as AND circuit gates or the like.

Moreover, it should be further understood that while the diffused impedance apparatus of the invention has been described with particular cross-sectional and/or longitudinal configurations including symmetrical as well as asymmetrical ones may be employed, and that three or more different resistivity characteristics may also be employed.

Thus, while the invention has been particularly shown and described with reference to the preferred embodiments, it will be understood by those skilled in the art that the foregoing and other changes in form and detail may be made therein without departing from the spirit and scope of the invention.

I claim:

1. A monolithic integrated circuit apparatus comprising:

a semiconductor substrate having at least one planar face;

a plurality of transistors, each of said transistors having input, output, and common electrode diffused regions formed in said substrate inwardly from said face;

a plurality of input/output terminals and bias and ground power supply terminal means positioned along the periphery of and insulated from said face;

a plurality of bias conductive path means, each of said bias conductive path means coupling the output region of a preselected one of the transistors to one of said power supply terminal means;

a plurality of input signal path means, each of said input signal path means having substantially the same fixed impedance value, each of a predetermined number of said input path means coupling the input region of a preselected one of the transistors to a respective output region of another transistor, and each of a predetermined number of said input signal path means coupling the input region of a preselected transistor to a preselected one of the input/output terminals;

metal conductor means positioned on said face having metal conductor elements for coupling the common regions of said transistors to the other of said power supply terminal means;

a plurality of high resistivity diffused equal-value resistor first regions formed in said substrate inwardly from said face;

a plurality of high resistivity diffused equal-value resistor second regions formed in said substrate inwardly from said face;

a plurality of low resistivity diffused equal-value resistor third regions formed in said substrate inwardly from said face, the resistance value of said first, second and third regions being different with respect to each other; each of said bias conductive path means comprising a mutually exclusive one of said high resistivity resistor first regions, each of said input signal path means comprising a predetermined portion of a mutually exclusive one of said high resistivity resistor second regions, some of said input signal path means further comprising at least a mutually exclusive one of said low resistivity resistor third regions, and said metal conductor means further having a plurality of metal conductor elements comprised in said bias conductive and input signal path mans, the metal conductor elements of said bias conductive path means being connected in contacting relationship to the resistor first regions in a predetermined manner to provide the coupling of the output regions of said transistors and said one of said power supply terminal means; and the metal conductor elements of said input signal path means being connected to the high resistivity resistor second regions and the lower resistivity resistor third regions to provide the coupling of said input regions of said transistors and said preselected ones of said input/output terminals; and means for insulating each of said conductor elements from said face along those portions of the particular conductor element not in contact relationship with a diffused region of the substrate.

2. A monolithic integrated circuit apparatus according to claim 1 wherein said integrated circuit apparatus is of the resistor-transistor logic circuit type.

3. A monolithic integrated circuit apparatus according to claim 1 wherein said input, output, and common regions of each of said transistors are the base, collector, and emitter, respectively, of the particular transistor.

4. A monolithic integrated circuit apparatus according to claim 1 wherein said transistors are of the bipolar type.

5. A monolithic integrated circuit apparatus according to claim 1 wherein each of said bias conductive path means has substantially the same fixed impedance value.

6. A monolithic integrated circuit apparatus according to claim 1 wherein at least the resistor second and third regions are arranged in parallel relationship with respect to one of the coordinate axes of a preselected coordinate system and at least some of said metal conductor elements are arranged in a parallel relationship with respect to another axis of said preselected coordinate system, said second and third regions providing undercrossings for preselected ones of said metal conductor elements.

7. A monolithic integrated circuit apparatus according to claim 1 wherein said coordinate system is of the rectangular type.

8. An interconnection grid having a predetermined coordinate system, said grid comprising in combination:

a semiconductor substrate having at least one planar face;

plural sets of diffused regions formed in said substrate inwardly from said face, said diffused regions being arranged in a substantially parallel relationship with one of the coordinate axes of said coordinate system, each of the resistor regions of the same particular set having substantially equal resistance values with respect to each other, the resistance values of at least two first and second sets being different with respect to each other;

a plurality of metal conductors positioned on said face, at least some of said metal conductors being arranged in a substantially parallel relationship with another coordinate system;

said metal conductors being connected in contacting relationship to said diffused regions in a predetermined manner for providing a plurality of interconnecting conductive paths, each of said paths having at least a mutually exclusive one of said diffused regions and each of said regions providing a predetermined portion of the impedance of said path, at least two of said paths having equal impedance values, and at least one of said last-mentioned two paths having a mutually exclusive one of said regions of said first set and a mutually exclusive one of said regions of said second set; and means for insulating those portions of said conductors which are not in contacting relationship with said diffused regions, said diffused regions further providing undercrossings for predetermined ones of said metal conductors.

9. An interconnection grid according to claim 8 wherein each of said interconnecting paths have substantially equal impedance values.

10. An interconnection grid according to claim 8 wherein said coordinate system is of the rectangular type.

11. A monolithic integrated circuit apparatus having a plurality of spatially distributed integrated circuit components disposed in a common substrate, preselected ones of said components requiring substantially equal-impedance interconnection paths to predetermined others of said components, each component of said preselected ones being disposed at a different distance to the particular component of said predetermined others to which it is required to be connected by one of said equal-impedance paths, said apparatus comprising:

plural sets of diffused resistor regions disposed in said substrate, the resistor regions of at least a first one of the sets having a different resistivity than the resistivity of the resistor regions of at least another second one of the other sets, each of the resistor regions of the same particular set having substantially equal resistance values with respect to each other, the resistance values of at least said first and second sets being different with respect to each other; and interconnection means for interconnecting preselected ones of said resistor regions of said sets in a predetermined manner to provide said plural equal impedance paths, at least one of said equal impedance paths comprising at least one mutually exclusive resistor region from said first set and at least one mutually exclusive resistor region from said second set.

12. Circuit apparatus according to claim 11 wherein said preselected circuit components are of the active type, each of said active type components further comprising a bipolar transistor having base, emitter and collector regions, and each of said equal impedance paths providing a signal path interconnecting the collector region of one of said transistors from the preselected components to the collector region of one of said transistors from the predetermined components.